US006963119B2

United States Patent
Colgan et al.

(10) Patent No.: US 6,963,119 B2
(45) Date of Patent: Nov. 8, 2005

(54) INTEGRATED OPTICAL TRANSDUCER ASSEMBLY

(75) Inventors: Evan G. Colgan, Chestnut Ridge, NY (US); Casimer M. DeCusatis, Poughkeepsie, NY (US); Lawrence Jacobowitz, Wappingers Falls, NY (US); Daniel J. Stigliani, Jr., Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 10/250,050

(22) Filed: May 30, 2003

(65) Prior Publication Data

US 2004/0241892 A1 Dec. 2, 2004

(51) Int. Cl.[7] .......................................... H01L 31/0232
(52) U.S. Cl. ........................ 257/432; 257/431; 438/48; 438/54; 438/65; 385/14; 385/52
(58) Field of Search ............................... 257/431–432; 438/22, 48, 62; 385/14, 52

(56) References Cited

U.S. PATENT DOCUMENTS

| | | | |
|---|---|---|---|
| 5,155,786 A | 10/1992 | Ecker et al. | |
| 5,285,466 A | 2/1994 | Tabatabaie | |
| 5,337,391 A | 8/1994 | Lebby | |
| 5,420,954 A | 5/1995 | Swirhun et al. | |
| 5,574,814 A | 11/1996 | Noddings et al. | |
| 5,631,988 A | 5/1997 | Swirhun et al. | |
| 5,781,682 A | 7/1998 | Cohen et al. | |
| 5,815,621 A | 9/1998 | Sakai et al. | |
| 5,862,281 A | 1/1999 | Shahid | |
| 6,016,211 A | 1/2000 | Szymanski et al. | |
| 6,056,448 A | 5/2000 | Sauter et al. | |
| 6,118,917 A | * 9/2000 | Lee et al. ..................... 385/49 |
| 6,434,316 B1 | 8/2002 | Grois et al. | |
| 6,450,704 B1 | 9/2002 | O'Connor et al. | |
| 2002/0031313 A1 | 3/2002 | Williams | |
| 2002/0041741 A1 | 4/2002 | Ciemiewicz | |
| 2002/0122637 A1 | 9/2002 | Anderson et al. | |
| 2002/0146216 A1 | 10/2002 | Schofield et al. | |
| 2002/0150357 A1 | 10/2002 | Hammond et al. | |
| 2003/0008560 A1 | 1/2003 | Tolmie | |
| 2003/0031428 A1 | 2/2003 | Wickman et al. | |

* cited by examiner

*Primary Examiner*—Dung A. Le
(74) *Attorney, Agent, or Firm*—James Cioffi; Cantor Colburn LLP

(57) ABSTRACT

An integrated optical transducer assembly includes a substrate and an optoelectronic array attached to the substrate. The optoelectronic array further includes a plurality of individual subunits bonded together to form a single array, with each of the subunits including a defined number of individual optoelectronic elements associated therewith. The elastomeric material maintains an original alignment between the plurality of subunits.

15 Claims, 3 Drawing Sheets

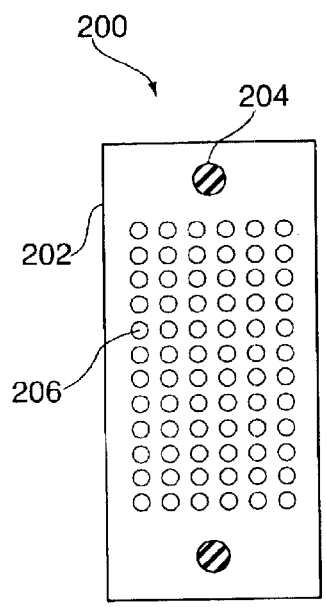
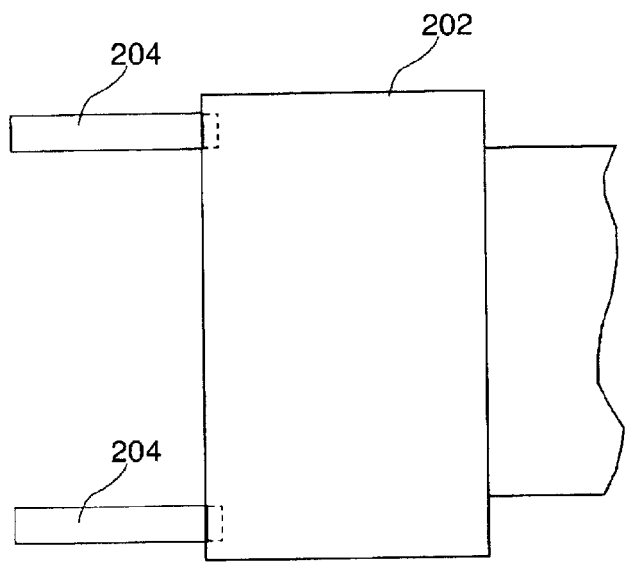
Fig. 2(a)  Fig. 2(b)
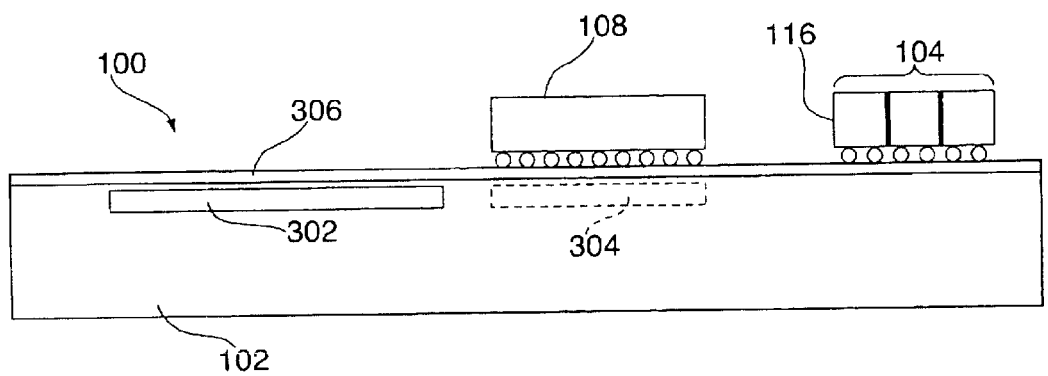
FIG. 3

INTEGRATED OPTICAL TRANSDUCER ASSEMBLY

BACKGROUND OF INVENTION

The present invention relates generally to optical communication systems and, more particularly, to an integrated optical transducer assembly for high speed, parallel optical communication data links.

There are many well-recognized benefits of using optical fiber to replace copper wiring for printed circuit boards (PCBS) in high speed electronic systems such as computer systems, switching systems, and networking systems. Such potential benefits include increased bandwidth and data rate, overcoming bottlenecks in the processing architecture, immunity to electromagnetic interference and reductions in radiated electromagnetic noise from the system, reduced latency by placing optical/electrical (OLE) conversion as close as possible to the signal originating circuits (e.g., computer processors) in order to minimize electrical attenuation, more dense packaging at lower cost per pin, and enablement of new processor interconnect technologies such as meshed rings. These and other factors directly contribute to the performance of the computer system (e.g., increased processing power in MIPS (million instructions per second) or FLOPS (floating-point operations per second), increased node count in parallel architectures, etc.).

With the dramatic increase in processor speed over the last several years and the anticipation that this trend will continue, the copper interconnect technology will be unable scale to the bandwidth requirements of the processing units, especially for large symmetric multi-processing (SMP) systems. Fiber optic components, on the other hand, do not suffer from bandwidth/distance constraints of copper and are thus becoming a preferred medium for very high bandwidth transmission between high speed electronic (e.g., processing) units. But, in order to fully realize these benefits, the optical fiber interconnect components should also continue to provide the same benefits of the existing electrical connection technologies.

At present, conventionally fabricated optoelectronic transducers typically include light emitting devices such as a Vertical Cavity Surface Emitting Laser (VCSEL) configured in a laser array, as well as light detecting devices such as photodiodes configured in a photodiode (PD) array. In addition, supporting high speed circuits (e.g., fabricated from a silicon bipolar, SiGe or GaAs material) are used to condition a signal when driving a VCSEL or receiving a signal from a PD. Such devices are typically disposed on a printed circuit board along with the computer circuits. Because a VCSEL array is generally formed of a different material than silicon, the array may not match thermally with preferred substrate materials. More specifically, there generally is a thermal coefficient of expansion (TCE) mismatch between the optical device material and the substrate material. As such, this physical limitation does not allow for a significantly large array of VCSELs (fabricated within a GaAs chip) to be placed on a silicon, organic, or ceramic substrate. Without a sufficiently large VCSEL/PD array, the high density signal requirements for complex processor interconnects are not met. Accordingly, it would be desirable to be able to be able to configure larger arrays of VCSEL devices and/or PD devices on a substrate even if there are TCE mismatches therebetween.

SUMMARY OF INVENTION

The foregoing discussed drawbacks and deficiencies of the prior art are overcome or alleviated by an optoelectronic array including a plurality of individual subunits, each of the subunits having a defined number of individual optoelectronic elements formed therein. The plurality of subunits are bonded to one another with an elastomeric material, which maintains an original alignment between the plurality of subunits.

In another aspect, an integrated optical transducer assembly includes a substrate and an optoelectronic array attached to the substrate. The optoelectronic array further includes a plurality of individual subunits bonded together to form a single array, with each of the subunits including a defined number of individual optoelectronic elements associated therewith.

In still another aspect, a method for forming an optoelectronic array includes defining a plurality of optoelectronic devices within a bulk material, and forming a plurality of trenches within a top side of the bulk material so as to isolate said plurality of optical devices into subgroups. The trenches are filled with an elastomeric material, and a portion of the bulk material is removed at a bottom side thereof until the elastomeric material is exposed. The elastomeric material maintains an original alignment between the subgroups.

BRIEF DESCRIPTION OF DRAWINGS

Referring to the exemplary drawings wherein like elements are numbered alike in the several Figures:

FIG. 2(a) is an exemplary fiber optic connector that may be used in conjunction with the optoelectronic array shown in FIGS. 1(a) and 1(b);

FIG. 2(b) is a side view of the connector of FIG. 2(a);

FIG. 3 is a side view of an alternative embodiment of the integrated optical transducer assembly of FIGS. 1(a) and 1(b)

DETAILED DESCRIPTION

Disclosed herein is an integrated optical transducer assembly that features a unique and highly integrated (with respect to electronic technology) packaging approach so as to provide a conversion of electronic signals to optical signals for interconnection between processing units. Briefly stated, an optoelectronic (O/E) array is fabricated from a plurality of smaller optical device array subunits bonded together by an elastomer polymer material so as to form a larger array of desired size. As is discussed hereinafter, this approach allows the attachment of dissimilar semiconductor optoelectronic (O/E) devices onto a common ceramic, organic, or silicon substrate, along with the appropriate support electronics. The result is a very high optical signal density package that can scale both in size (i.e., number of optoelectronic elements) and in speed.

Figure 1A:
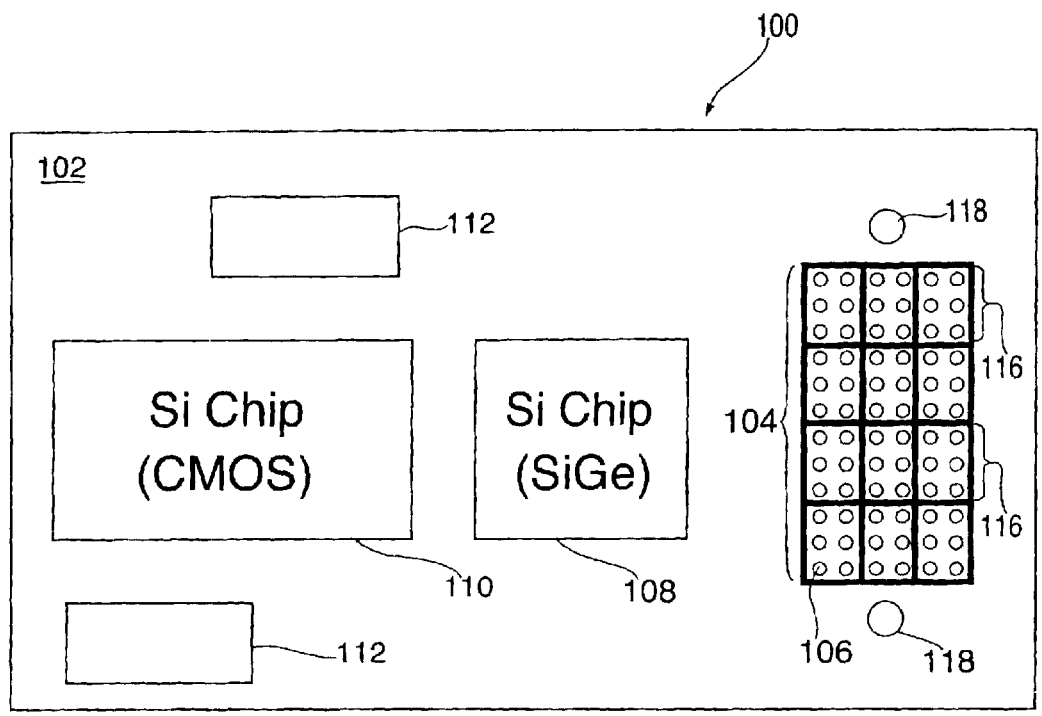
FIG. 1(a) is a top view of an integrated optical transducer assembly, in accordance with an embodiment of the invention.
Figure 1B:
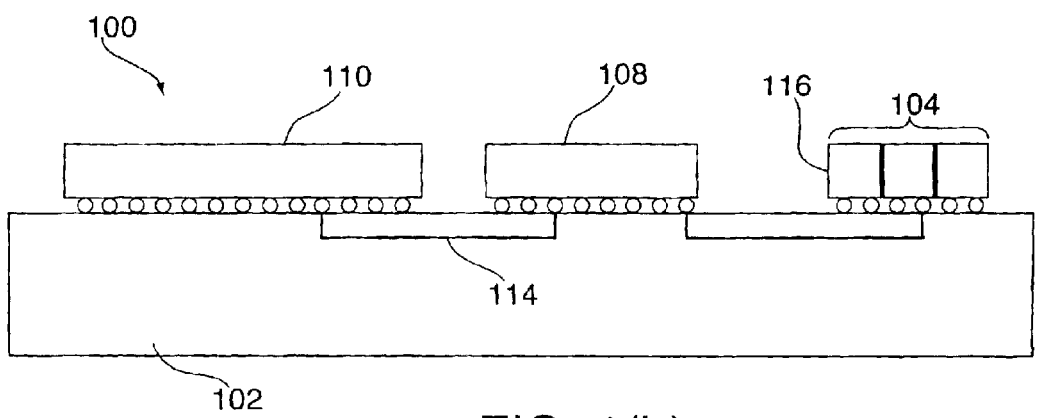
FIG. 1(b) is side view of the transducer assembly of FIG. 1(a)

Referring initially to FIGS. 1(a) and 1(b), there is shown an integrated optoelectronic transducer 100, in accordance with an embodiment of the invention. In the embodiment depicted, a substrate 102 has an optoelectronic (O/E) array 104 of individual optoelectronic devices 106 disposed thereon. The substrate 102 may be made from a multilayer ceramic material, or a silicon wafer, for example. The optoelectronic devices 106 generally comprise a plurality of light emission devices (e.g., VCSELs) or, alternatively, a plurality of light detection devices (e.g., photodiodes). If the transducer 100 is configured as a transceiver, then both VCSEL and PD arrays may be included upon the substrate 102.

The O/E transducer 100 also includes signal conditioning chips used to provide an interface to standard computer logic circuits. A high speed chip 108 (e.g., a silicon bipolar material such as SiGe or GaAs) is attached to the substrate 102 in proximity to the array 104 to condition signals when driving a VCSEL array or for receiving signals from a PD array. In particular, the high speed chip 108 is used to multiplex many incoming computer data signals into a smaller number of higher speed electronic signals (still on the order of hundreds of signals) to be converted to a corresponding optical signal(s) by driving an individual VCSEL. The resulting signal speed through connecting fibers (not shown in FIG. 1) may be greater than 50 Gb/s, with a total optical interface of tens or hundreds of terabytes per second.

In addition, a silicon CMOS signal processing chip 110 may be used to encode the signal data to yield a DC balanced signal, which is thereafter used by the corresponding receiver (not shown) to achieve maximum performance. If the transducer 100 serves as a receiving module, then the SiGe chip 108 is used to amplify the signal and demultiplex it. The CMOS signal processing chip 110 then decodes the demultiplexed signal and returns it back to the original computer data format. In addition to CMOS signal processing chip 110, the transducer 100 may contain several other CMOS chips 112, which may be one or more computer microprocessor chips, memory controllers, and the like to realize a computer processing system that is optically interconnected to one or more like computer processing systems (e.g., in an SMP configuration).

The formation of the O/E array 104, SiGe chip 108, and CMOS signal processing chip 110 (and another CMOS chips 112) on a common substrate 102 thus results in a very high speed interconnection package in the form of a multi-chip transducer module (MCM). As will also be appreciated, the substrate 102 may further include additional chips (not shown) such as microprocessors, memory controllers, and the like, that form part of a computer system. Electrical connection between the components is achieved through copper, or other conductor, signal layers 114 formed within the substrate 102, as illustrated more particularly in FIG. 1(b). This integrated arrangement will allow for a very high density of optical signals per square millimeter of surface area (e.g., â¥3000 signals/mm$^2$), well in excess of the previous capabilities. The bonding of the array 104 and chips 108, 110 to substrate 102 may be accomplished by C4 and "flip chip" techniques, known to those skilled in the art. It should be noted that fine pitch connections are enabled by TCE matching of the chips and substrate.

As indicated previously, a VCSEL or PD array is generally formed from a different material (e.g., GaAs) than silicon and is not thermally expansion matched to silicon. For example, the TCE of silicon is about 2.8 ppm/Â° C., the TCE of GaAs is about 5.7 ppm/Â° C., and the TCE of an organic substrate such as FR4 is about 17 ppm/Â° C. Such TCE mismatches can cause mechanical shearing and damage to the interconnects between components over time. Heretofore, this physical limitation has prevented large individual arrays of VCSELs to be directly mounted upon a substrate. For example, the TCE mismatch has previously limited chip sizes to about 10 mm. Thus, in accordance with a further aspect of the invention, the array 104 is formed by a multiplicity of smaller arrays or "subunits" affixed together by elastomer bonding so as to create a larger array of desired size. Thereby, the thermal constraints of the dissimilar materials are obviated by the ability of the polymer material to plastically deform, thus accommodating the different expansion and contraction of the materials with varying temperature.

In the example illustrated, the array 104 of FIGS. 1(a) and 1(b) further includes a plurality of subunits 116 of 2×3 VCSELs (or photodiodes) formed within a III–V compound (e.g., GaAs) semiconductor material. The aggregate of the bonded subunits thus forms an overall, 6×12 device array 104. It will be appreciated, however, that a greater number of individual subunits may be used to form even larger arrays. It should also be appreciated that the particular size of the individual subunits 116 in the illustrated embodiment is exemplary in nature, and a greater or lesser number of optical devices may be included in each subunit. An exemplary fabrication process for the array 104 is discussed in greater detail hereinafter.

Still referring to FIG. 1(a), the transducer 100 further includes a pair of alignment holes 118 adjacent opposing ends of the O/E array 104 so as to facilitate alignment with a corresponding a multi-fiber connector/cable assembly 200, illustrated in FIGS. 2(a) and 2(b). The connector assembly 200, similar to an MTP connector presently used in the industry, includes a molded plastic ferrule 202 having holes at precise positions for accommodating a pair of alignment pins 204. Again, although a 6×12 array is illustrated in FIG. 2(a), larger connector sizes are also contemplated. As will be appreciated, the fiber array pitch of optical fibers 206 included in connector assembly 200 matches the pitch of the O/E array elements 106 in the transducer 100. The alignment pins 204 of the connector assembly 200 are configured to mate with the alignment holes 118 in the substrate 102 in order to insure the fibers 206 are aligned to the corresponding light emitting or receiving devices 106 in the array 104.

The connector assembly 200 thus plugs into the integrated optical transducer vertically with respect to the plane of the substrate 102. In addition, the substrate 102 of the transducer 100 may be configured so as to detect the presence of the metal alignment pins 204 inserted therein by corresponding changes in capacitance and/or resistance. This information could be used, for example, to prevent activation of VCSELs until the pins are inserted a minimum distance within the alignment holes 118. Alternatively, the substrate 102 could also be configured to house the alignment pins 204, if the connector 200 is configured as a female connector.

FIG. 3 illustrates an alternative embodiment of the transducer 100 shown in FIG. 1. In this embodiment, the CMOS circuitry (i.e., chips 110, 112 of FIG. 1) is embedded within the same silicon substrate 102 used as the carrier for the O/E transducer array 104, as well as for the high speed SiGe multiplexer/demultiplexer chip 108. This is depicted by the embedded region 302 in FIG. 3. Moreover, since the substrate 102 is a silicon wafer in this embodiment, it should also be possible to embed the high speed (SiGe) chip function 108 therein, just as is the case with other CMOS circuitry. Thus, FIG. 3 also shows an embedded (dashed) SiGe circuit area 304 as still a further embodiment. Regardless of the particular embodiment implemented, the three basic components (i.e., the CMOS circuitry, SiGe circuitry, and transducer array) are preferably interconnected with one another through standard, multilayer metal interconnect technology (e.g., copper or aluminum layers 306), as well as through the flip chip C4 bonding known in the art.

Figure 4A:
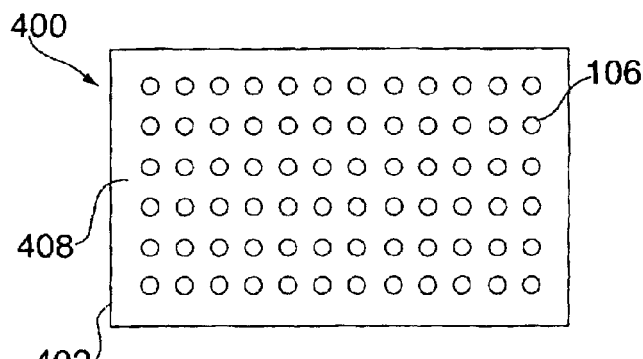
FIGS. 4(a) through 4(f) illustrate a method of forming an integrated optoelectronic array, in accordance with a further embodiment of the invention.
Figure 4B:
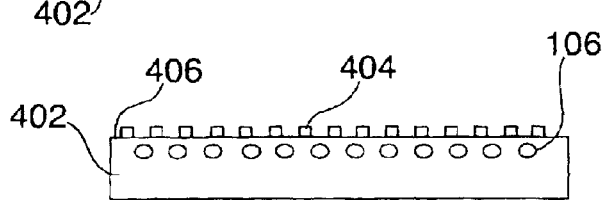

Referring now to FIGS. 4(a)–(f), there is illustrated an exemplary process for forming a VCSEL (or photodiode) array as described earlier. As shown in FIG. 4(a), a bulk O/E array 400 is first fabricated using processes known in the art for producing the individual VCSELs or photodiodes on a semiconductor substrate 402. The resulting spacing (pitch) between the individual devices is dependent on the mask design, as well as the desired subunit size and number of devices in the final array, among other aspects. The optical devices 106 are fabricated near the surface of the semiconductor substrate material (e.g., GaAs, InGaAsP), while contact pads 404 are formed on a top surface 406 of the substrate 402, as shown in FIG. 4(b).

If the array includes transmission elements, the VCSELs are grown with integrated mirrors, as is known in the art. However, in the present application, the reflectivity of the mirrors and the optical wavelength is specifically chosen such that the light from the VCSEL exits the bottom surface 408 of the wafer (i.e., the VCSELs are back-emitting devices since the light exits the opposite of the chip from where the electrical connections are made). If the array includes detection elements, the photodiode (PD) structure is also chosen such that detected light can pass through the bottom surface 408 of the substrate 402 to be collected by the PD junction. As with a VCSEL array, the electrical contacts for a PD array are also formed on the top surface 406 of substrate 402.

Figure 4C:
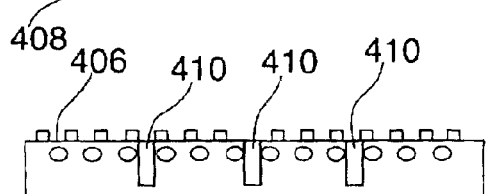

As shown in FIG. 4(c), a trench pattern 410 is etched into the top surface 404 of the substrate 402 through appropriate masking, photolithographic and reactive ion etch processes. It is this process that ultimately defines the desired subunits of individual optical devices comprising the array. The trench configuration is an x-y grid type configuration (i.e., horizontally and vertically disposed trenches with respect to the top surface 406) such that a set of subunits is defined. Again, in the example illustrated, the horizontal and vertical trenches are configured such that the resulting pattern defines a set of "isolated", 2×3 VCSEL subunits. It will be noted that the trench etch depth does not extend through the entire thickness of the array so as to physically separate the subunits, thereby maintaining mechanical stability during a subsequent bonding process. Thus, for a substrate 402 having an exemplary starting thickness of about 400 microns (Î¼ m), a sufficient trench etch depth may be about 200–350 Î¼ m. An exemplary trench width may be about 50 Î¼ m, wherein the contour of the trench sides may be either smooth or, alternatively, roughened/corrugated to increase surface area and bonding strength.

Figure 4D:
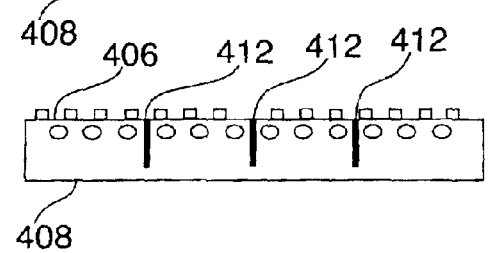

As shown in FIG. 4(d), the trench areas are filled with an elastomeric polymer material 412, such as a polyimide. This may be implemented, for example, through spin coating of a photo imageable polyimide layer. The polyimide is stable to about 400 Â° C. and can withstand eutectic solder processing used in subsequent C4 bonding. Advantageously, the use of the polyimide bonding agent enables elasticity between the subunits by expanding and contracting in unison with the substrate subsequently attached thereto. In addition, curing of the top portion of the polyimide provides mechanical strength.

Figure 4E:
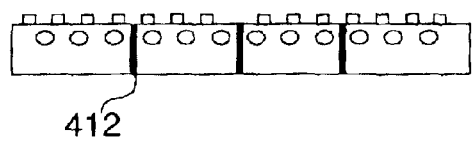
Figure 4F:
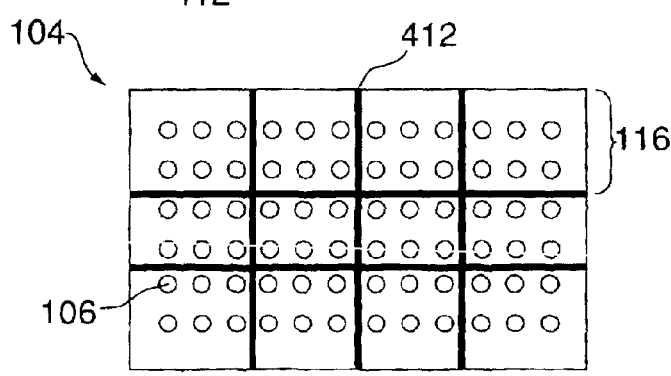

Finally, as shown in FIG. 4(e), the bottom surface 408 of the substrate 402 is lapped away until the bottom of the trench polyimide material 412 is exposed. At the completion of this step, the subunits are completely formed and held together solely by the elastomeric polymer. If the bulk array 400 is initially of a size sufficient for producing multiple O/E arrays, then the bulk array 400 may then be diced to produce the desired O/E array sizes. A bottom view of a completed 6×12 O/E array 104 is illustrated in FIG. 4(f). The top surface (not shown in FIG. 4(f)) contains the C4 solder ball contacts to be flip chip bonded to the O/E array on a substrate 102 as shown in FIGS. 1 and 3.

It will be recognized that the completed O/E array 104 could be fabricated by alternative means, such as by dicing the bulk substrate 400 into individually separated subunits and thereafter bonding the subunits with elastomeric polymer material. However, this approach would entail more complicated alignment procedures to ensure the individual optical devices comprising the array have the proper location and spacing. The present trench etching, polymer filling and backside lapping approach alleviates this concern.

As will be appreciated, the above described integrated optical transducer assembly and optoelectronic array allows for the bonding of optical element arrays (e.g., VCSELs, photodiodes) to ceramic, silicon or other thermally dissimilar chip carriers. By forming a larger array from a group of bonded array subunits with a flexible material, mechanical stresses between the array and substrate are relieved. Moreover, the placement of the O/E array on the same substrate as the support circuitry such as high speed chips and CMOS chips allows for these three main components to be disposed in relative proximity to one another, thereby maintaining good signal integrity and allowing for device scaling with future computer speeds.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An optoelectronic array, comprising:
    a plurality of individual subunits, each of said subunits having a defined number of individual optoelectronic elements formed therein; and
    said plurality of subunits bonded to one another with an elastomeric material;
    wherein said elastomeric material maintains an original alignment between said plurality of subunits.

2. The optoelectronic array of claim 1, wherein said elastomer material is a polyimide.

3. The optoelectronic array of claim 1, wherein said individual optoelectronic elements further comprise one of: a vertical cavity surface emitting laser (VCSEL), a photodiode and combinations comprising at least one of the foregoing.

4. The optoelectronic array of claim 1, wherein said plurality of bonded subunits form an array of at least 6×12 individual optical elements.

5. An integrated optical transducer assembly, comprising:
    a substrate; and
    an optoelectronic array attached to the substrate, said optoelectronic array further comprising a plurality of individual subunits bonded together to form a single array, each of said subunits including a defined number of individual optoelectronic elements associated therewith.

6. The optical transducer assembly of claim 5, further comprising:

a high speed chip disposed on said substrate and in proximity to said optoelectronic array, said high speed chip configured for signal interface with said optoelectronic array;

an encoding/decoding chip disposed on said substrate and in proximity to said optoelectronic array; and one or more computer processing chips disposed on said substrate and in proximity to said optoelectronic array.

7. The optical transducer assembly of claim 5, further comprising:

a high speed circuit embedded within said substrate and in proximity to said optoelectronic array, said high speed chip configured for signal interface with said optoelectronic array;

an encoding/decoding chip embedded within said substrate and in proximity to said optoelectronic array; and one or more computer processing chips embedded within said substrate and in proximity to said optoelectronic array;

wherein said substrate further comprises a silicon substrate.

8. The optical transducer assembly of claim 5, wherein said optoelectronic array has a different coefficient of thermal expansion than said substrate.

9. The optical transducer assembly of claim 5, wherein said plurality of subunits of said optoelectronic array are bonded to one another with an elastomeric material, wherein said elastomeric material maintains an original alignment between said plurality of subunits.

10. The optical transducer assembly of claim 5, wherein said individual optoelectronic elements further comprise one of: a vertical cavity surface emitting laser (VCSEL), a photodiode and combinations comprising at least one of the foregoing.

11. The optical transducer assembly of claim 5, wherein said substrate comprises one of a ceramic material, a silicon material and an organic material.

12. The optical transducer assembly of claim 5, wherein said optoelectronic array is formed from a group III–V compound material.

13. The optical transducer assembly of claim 5, further comprising a pair of alignment holes formed in said substrate, said alignment holes disposed adjacent opposing ends of said optoelectronic array, wherein said alignment holes are further configured to receive a corresponding pair of alignment pins of an optical connector, and wherein said pair of alignment holes are further configured to detect the presence of said alignment pins therein by capacitive coupling.

14. The optical transducer assembly of claim 5, further comprising a pair of alignment pins placed in said substrate, said alignment pins disposed adjacent opposing ends of said optoelectronic array, wherein said alignment pins are further configured to be inserted into a corresponding pair of alignment holes of an optical connector.

15. The optical transducer assembly of claim 5, wherein said optoelectronic array is attached to said substrate by flip chip bonding.

* * * * *